United States Patent
Wood et al.

(10) Patent No.: US 7,049,984 B2
(45) Date of Patent: May 23, 2006

(54) TIME-INTERLEAVED SAMPLERS

(75) Inventors: John M Wood, Great Baddow (GB); Nigel C. T Coote, Portsmouth (GB)

(73) Assignee: BAE Systems plc, London (GB)

( * ) Notice: Subject to any disclaimer, the term of this patent is extended or adjusted under 35 U.S.C. 154(b) by 0 days.

(21) Appl. No.: 10/518,896

(22) PCT Filed: Jun. 24, 2003

(86) PCT No.: PCT/GB03/02681

§ 371 (c)(1),
(2), (4) Date: Dec. 22, 2004

(87) PCT Pub. No.: WO2004/004130

PCT Pub. Date: Jan. 8, 2004

(65) Prior Publication Data

US 2005/0219091 A1 Oct. 6, 2005

(30) Foreign Application Priority Data

Jun. 26, 2002 (GB) ................................ 0214742.9

(51) Int. Cl.
*H03M 1/10* (2006.01)
(52) U.S. Cl. ...................... 341/120; 341/118; 341/141; 341/155
(58) Field of Classification Search ................ 341/118, 341/120, 141, 155
See application file for complete search history.

(56) References Cited

U.S. PATENT DOCUMENTS

| | | | |
|---|---|---|---|
| 4,345,241 A | * | 8/1982 | Takeuchi et al. ............. 341/118 |
| 4,763,105 A | * | 8/1988 | Jenq ............................. 341/120 |
| 4,968,988 A | * | 11/1990 | Miki et al. ................... 341/141 |
| 5,239,299 A | | 8/1993 | Apple et al. |
| 6,081,215 A | | 6/2000 | Kost et al. |

(Continued)

FOREIGN PATENT DOCUMENTS

EP 0 298 618 1/1989

(Continued)

OTHER PUBLICATIONS

R. Khoini-Poorfard, "Mismatch Effects in Time-Interleaved Oversampling Converters" *Circuits and Systems* 1994, pp. 429-432, unknown month.

(Continued)

*Primary Examiner*—Rexford Barnie
*Assistant Examiner*—Khai M. Nguyen
(74) *Attorney, Agent, or Firm*—Nixon & Vanderhye P.C.

(57) ABSTRACT

This invention relates to a method of calibrating a time-interleaved analogue-to-digital sampler (10) and to a method of performing analogue-to-digital conversion with a sampler (10) so calibrated. The invention provides a method of calibrating a sampler (10) comprising N time-interleaved ADCs (12*a–d*), the method comprising the steps of: (a) injecting in turn N calibration signals (13) into the sampler such that each calibration signal (13) occupies one of N related frequencies; (b) determining the input signal for each one of the N calibration frequencies (13); (c) measuring in the frequency domain the output at each of the N related frequencies for each one of the N calibration frequencies; and (d) determining the relationship that relates the input signal to the output at each of the N related frequencies for each one of the N calibration frequencies.

14 Claims, 2 Drawing Sheets

U.S. PATENT DOCUMENTS

| | | |
|---|---|---|
| 6,339,390 B1 | 1/2002 | Velazquez et al. |
| 6,522,282 B1 * | 2/2003 | Elbornsson .................. 341/155 |
| 6,556,156 B1 * | 4/2003 | Hungerbuehler ............ 341/120 |
| 2003/0080885 A1 * | 5/2003 | Tamba ......................... 341/120 |

FOREIGN PATENT DOCUMENTS

| | | |
|---|---|---|
| EP | 0 984 288 | 3/2000 |
| EP | 1 168 367 | 1/2002 |

OTHER PUBLICATIONS

Y. Jenq, Digital Spectra of Nonuniformly Sampled Signals: A Robust Sampling Time Offset Estimation Algorithm for Ultra High-Speed Waveform Digitizers Using Interleaving, *IEEE Transactions on Instrumentation and Measurement*, vol. 39, No. 1, Feb. 1990, pp. 71-75.

* cited by examiner

TIME-INTERLEAVED SAMPLERS

This application is the U.S. national phase of international application PCT/GB2003/002681, filed in English on 24 Jun. 2003, which designated the U.S. PCT/GB2003/002681 claims priority to GB Application No. 0214742.9 filed 26 Jun. 2002. The entire contents of these applications are incorporated herein by reference.

BACKGROUND OF THE INVENTION

1. Field of the Invention

This invention relates to a method of calibrating a time-interleaved analogue-to-digital sampler and to a method of performing analogue-to-digital conversion with a sampler so calibrated. The invention also extends to a calibration apparatus and to a channel equaliser.

2. Discussion of Prior Art

A commonly employed method of building high-speed samplers is to time-interleave multiple channels, each channel having its own analogue-to-digital converter (ADC). Each ADC takes it in turn to sample the analogue signal according to a sampling sequence, thereby producing its own digital signal that follows the shape of the analogue signal but at the sampling rate of the ADC. The digital signals from the ADCs can then be interleaved according to their sampling sequence to produce an output signal that follows the shape of the analogue signal, but at a faster effective sampling rate (for N channels, the sampling rate is N times the sampling rate of each ADC).

A problem with this approach is that the channels are not identical and sampling is not performed at exactly equally-spaced intervals, thereby degrading the performance of the sampler. This degradation can most simply be seen in the frequency spectrum of the time-interleaved digital output signal produced in response to a tone input: such a spectrum will contain spurious signals at specific frequencies in addition to the wanted signal at the frequency of the tone input. It is known that if a tone is injected into an N-channel time-interleaved sampler, mismatches between the N channels will lead to the generation of N frequency spikes in the range from zero to half the overall sampling frequency of the sampler (the N spikes comprising N−1 spurious spikes plus the wanted signal at the frequency of the tone input). Hence, signals are observed in the frequency spectrum at N related frequencies. The N frequencies are mixed by mismatches without affecting output across the rest of the frequency spectrum. Moreover, if a tone is input at any one of the N related frequencies, only those same N frequencies are affected.

SUMMARY OF THE INVENTION

The method described herein corrects for both frequency independent and frequency dependent amplitude and phase mismatches between channels. In correcting for frequency dependent phase mismatches it also inherently corrects for time delay errors between channels since a time delay is equivalent to a linear change of phase with frequency. Mismatches in any cross-talk (i.e. coupling) between channels is also inherently corrected for.

The actual frequencies at which signals in the output spectrum appear are related to N, to the input tone frequency $f_{in}$ and to the overall sampling rate of the sampler $f_s$, such that the frequencies can be found from the formula:

$$f_{in} + k \cdot \frac{f_s}{N}, \text{ where } k = 0, 1, 2, \ldots, N-1$$

At face value, this would lead to frequencies greater than half the overall sampling frequency of the sampler which is in contradiction to the position stated above. However, as is well know in the art, all values greater than half the overall sampling frequency are aliased into the range zero to half the overall sampling frequency of the sampler. For further explanation of this effect, see for example page 163 of 'An Introduction to the Analysis and Processing of Signals' by Paul A. Lynn, Third Edition, published by Macmillan. Hence, by 'N related frequencies' we mean the frequencies given by the formula above as modified by aliasing into the range zero to half the overall sampling frequency.

From a first aspect, the present invention resides in a method of calibrating a sampler comprising N time-interleaved ADCs, the method comprising the steps of: (a) injecting in turn N calibration signals into the sampler such that each calibration signal occupies one of N related frequencies; (b) determining the input signal for each one of the N calibration frequencies; (c) measuring in the frequency domain the output at each of the N related frequencies for each one of the N calibration frequencies; and (d) determining the relationship that relates the input signal to the output at each of the N related frequencies for each one of the N calibration frequencies.

Optionally, step (a) comprises injecting in turn N tones. This simplifies matters in that only a single frequency, corresponding to a desired one of the N related frequencies, is injected into the sampler at any one time. This is in contrast to the broader embodiment of the invention where a calibration signal comprising multiple frequencies, including the desired one of the N related frequencies, is injected into the sampler. Where this latter option is employed, the calibration signal should only contain one of the N related frequencies because introducing signals at two or more of the N related frequencies at one time will result in unwanted mixing of frequencies, although multiple sets of N related frequencies can be calibrated at the same time in this way.

As will be readily understood, choice of one of the N related calibration frequencies determines the remaining N related calibration frequencies according to the formula above (taking aliasing into account).

For each calibration signal, the frequency spectrum is measured in such a way as to allow the outputs at each of the N related frequencies to be measured. Optionally, to determine the frequency spectrum, step (c) further comprises performing a Fast Fourier Transform (FFT) of the digital outputs of the ADCs thereby to allow measurement in the frequency domain of the output at each of the N related frequencies. In general, the transform results in an output stored in a series of frequency bins, each frequency bin covering a small part of the frequency range of the overall range of the FFT. Optionally, the method further comprises the step of choosing the first of the N related frequencies such that all the resulting N related frequencies are substantially centred on bins of the FFT. This is of particular benefit where the calibration signals are tones, which otherwise have some of their signal spread into the surrounding bins.

As will be readily appreciated, the above method of calibration will lead to a calibration for signals in the output frequency spectrum at the N related frequencies only. Where an FFT has been used, there are likely to be many more than N frequency bins. Hence, only N of these frequency bins will be calibrated. Optionally, the step of repeating steps (a) to (d), injecting in turn N calibration frequencies into the sampler at a different set of N related frequencies, may be repeated until calibration frequencies corresponding to all frequency bins of the FFT have been injected. In this way, all frequency bins of the FFT can be calibrated by repeating the calibration method described above one or more times, choosing a different set of N related frequencies for each calibration iteration until all of the frequency bins of the FFT have been calibrated.

Optionally, adjacent bins of the FFT are grouped together and a single calibration frequency is used for each group. Moreover, the step of choosing the first of the N related frequencies maybe made such that all the resulting N related frequencies have frequencies substantially centred on the central frequency of the frequency range covered by the group of bins. Grouping bins together is advantageous as a calibration need not be performed for each and every bin of the FFT. The number of calibration iterations that are necessary will depend on the specific architecture of the sampler, how well the channels are matched and the required accuracy.

In addition, the input signal parameters, magnitude and/or phase, for each one of the N calibration frequencies is determined. The magnitude and phase together may be equivalently represented by a complex amplitude (i.e. a+ib). The magnitude and/or phase of the input signal may be determined directly from the calibration signal source, or measured independently from the sampler, or it may be estimated from a measurement of the output signal of the sampler.

In step (d), the relationship between the input signal and the output at each of the N related frequencies is determined. The magnitude and phase of the output at any of the N related frequencies will be dependent upon the magnitude and phase of the calibration frequency. The relationship between the input and output is that part of the transformation from input to output that is independent of the input. A correction factor may be determined from this relationship for each output at the N related frequencies generated by each of the N calibration frequencies.

Optionally, step (b) may comprise determining the magnitude and phase of the input signal for each one of the N calibration frequencies, step (c) comprises measuring in the frequency domain the magnitude and phase of the output at each of the N related frequencies for each one of the calibration frequencies and step (d) comprises determining correction factors from the relationship that relates magnitude and phase of the output at the N related frequencies to the magnitude and phase of the input signal. In a currently preferred embodiment, step (d) comprises determining N×N complex scaling factors that each give the contribution to the output of one of the N related frequencies due to the input at one of the N related frequencies and solving the equations represented by the scaling factors to determine the N×N correction factors that each give the contribution to the correction of the N related frequencies applied to the output at each of the N related frequencies in order to equalise the sampler at these frequencies.

Optionally, the N×N scaling factors relating the input to the output may be stored in the rows and columns of an N by N matrix referred to here as a 'relationship matrix'. Similarly, the N×N correction factors may be stored in an N by N matrix referred to here as a 'correction matrix'. A correction matrix may be formed for each iteration of the calibration process.

From a second aspect, the present invention resides in a method of performing an analogue to digital conversion using a sampler comprising N time-interleaved ADCS, wherein the sampler has been calibrated in accordance with the method described herein above, the method of performing an analogue to digital conversion comprising the steps of (i) injecting an analogue signal into the sampler; (ii) measuring in the frequency domain the resulting spectrum produced by the sampler; and (iii) adjusting the measured frequency spectrum in response to the relationships determined during calibration thereby to produce a channel-equalised spectrum.

Where the method of calibration included the optional step of forming one or more correction matrices, step (iii) may comprise multiplying the measured frequency spectrum by one or more correction matrices. Where an FFT is used to obtain the frequency spectrum of the output during calibration and channel equalisation, the correction matrices can conveniently be used to correct the outputs in the corresponding bins of the FFT.

As a final step, if required, a time domain output signal can be generated by performing the inverse of the FFT.

The present invention also extends to a computer for use with the methods described herein above when programmed to perform the steps of: (1) receiving the measurements of the output at each of the N calibration frequencies for each one of the N calibration frequencies; (2) receiving the determination of the input signal for each one of the N calibration frequencies; and (3) determining the relationship that relates the input signal to the output at each of the N related frequencies for each one of the N calibration frequencies. Furthermore, the present invention extends to a computer program product comprising program instructions for causing a computer to operate in accordance with method described immediately above.

BRIEF DESCRIPTION OF THE DRAWINGS

In order that the invention can be more readily understood, reference will now be made, by way of example only, to the accompanying drawings in which.

DETAILED DISCUSSION OF EMBODIMENTS

Figure 1:
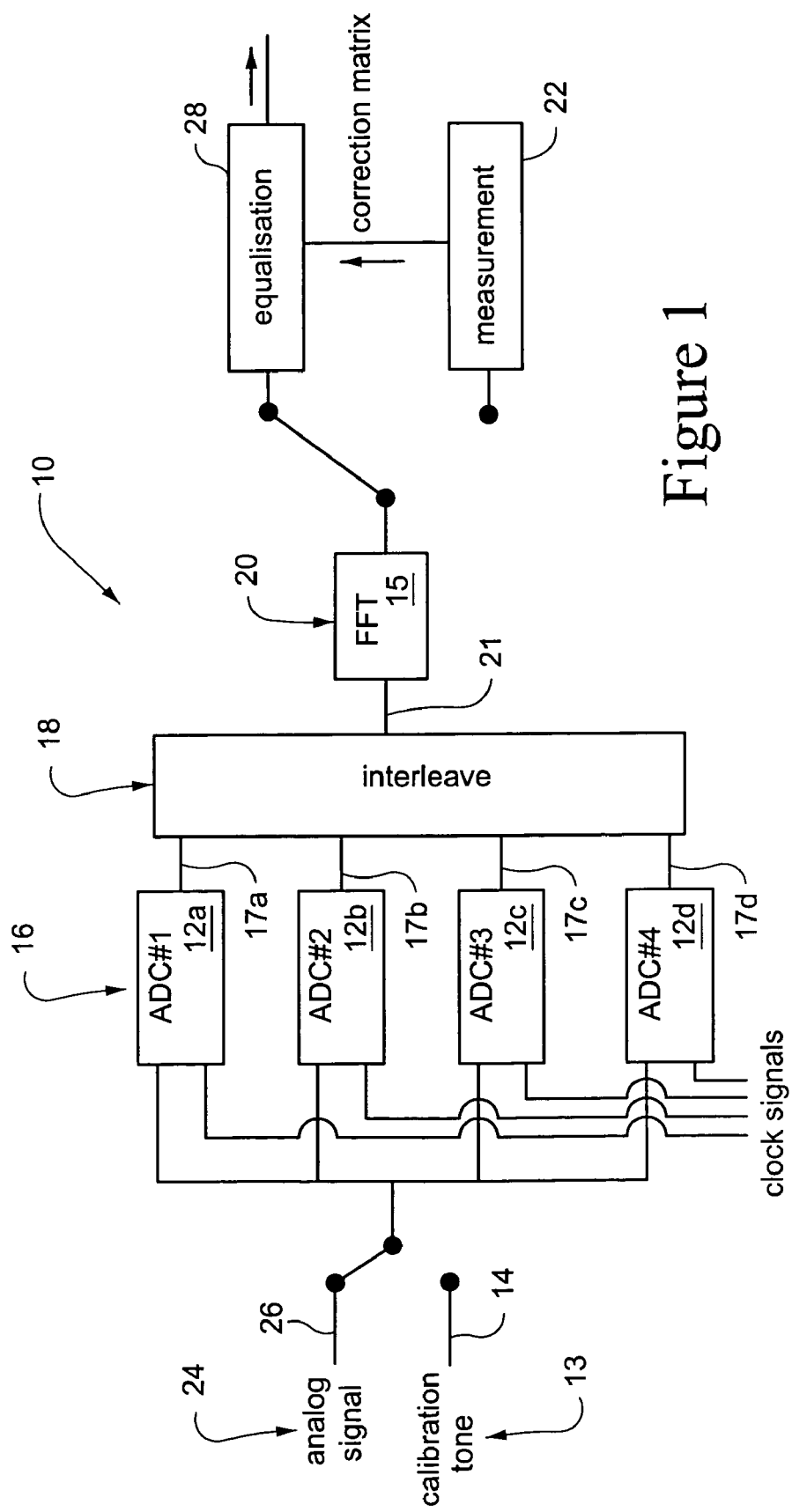
FIG. 1 is a simplified sketch of the method of the present invention.
Figure 2A:
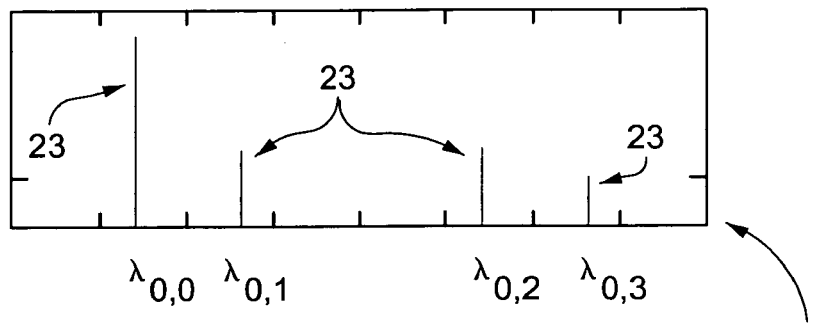
FIGS. 2a–d illustrate frequency spectra measured at the output of the A-D sampler.
Figure 2B:
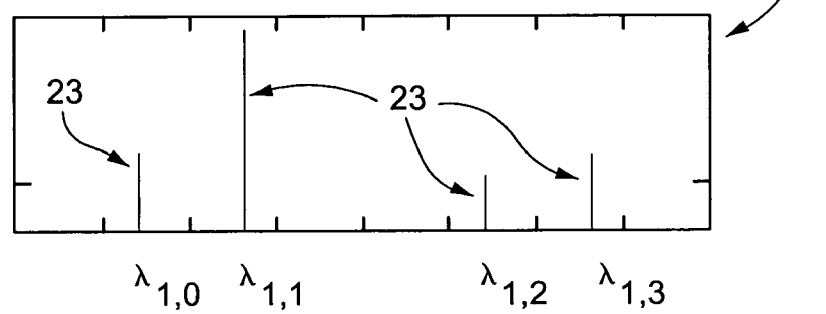
Figure 2C:
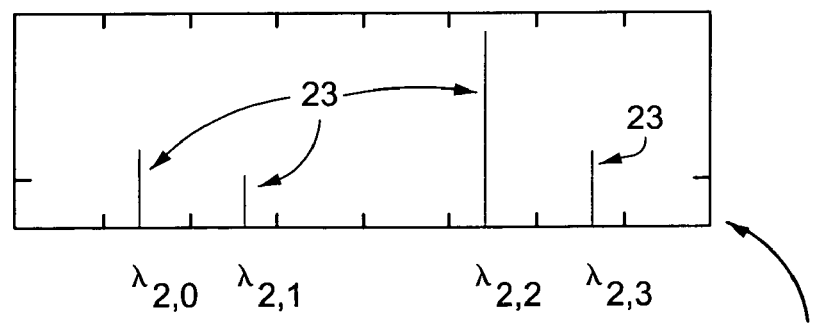
Figure 2D:
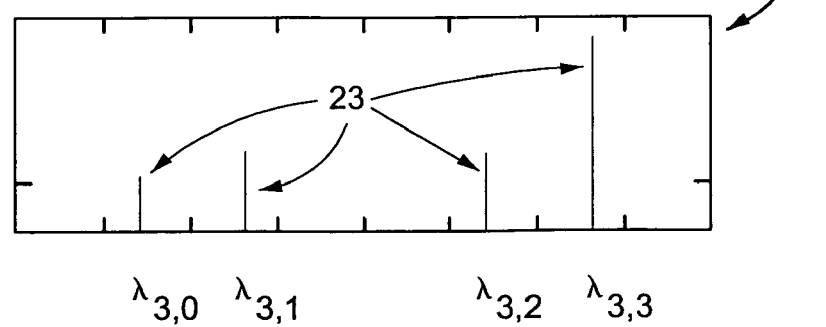

FIG. 1 shows a sampler 10 comprising four time-interleaved ADCs 12a–d (and hence four channels). As will be readily apparent, extension of the present invention to samplers comprising different numbers of channels is straight-forward. In this instance, the sampler 10 is largely software implemented such that the interleaving, the FFT, the calculation of the correction matrices and the channel equalisation operation are all performed by a computer processor (not shown). However, the invention could just as easily be implemented in electronic or part-electronic form.

Operation of the sampler 10 is performed in three stages, as is shown generally in FIG. 1.

During the first stage, calibration tones 13 covering the frequency range of the FFT 15 are injected one at a time into the sampler 10 at 14. The calibration tones 13 are sampled by the ADCs 12a–d at 16 and their outputs 17a–d are interleaved at 18. The frequency spectrum 19 of the interleaved output 21 for each calibration tone 13 is obtained using an FFT 15 at 20. The complex amplitudes of the spikes 23 in the frequency spectrum 19 at the four output frequencies are measured at 22 (remembering that in this instance we have a four channel sampler and so N=4).

For the second stage, a 4×4 relationship matrix is calculated from the measured complex amplitudes of the spikes 23 in the frequency spectrum 19 at each of the four related frequencies for each set of four calibration tones 13. The inverse of each relationship matrix is then calculated to determine the correction matrix. Thus, each set of four related frequencies produces a single correction matrix that can be used to equalise a group of four frequency bins of the FFT 15. Enough sets of four calibration tones 13 are used so that every one of the frequency bins are calibrated. In this example, the FFT 15 has 1024 frequency bins and so 256 sets of four calibration tones 13 are required and 256 correction matrices are produced.

The third stage is during normal operation of the sampler 10 where an analogue signal 24 is injected into the sampler 10 at 26. The analogue signal 24 is then sampled by the four ADCs at 16, as per the preceding calibration stage. In common with the calibration stage, the outputs from the ADCs 17a–d are interleaved at 18 and the frequency spectrum 19 of the interleaved output 21 is obtained by the FFT 15 at 20. The method of normal operation now differs from the method of calibration in that channel equalisation is performed at 28 by multiplying the contents of each group of four frequency bins of the FFT 15 by the corresponding correction matrix.

In more detail, the four-channel sampler 10 is calibrated over a number of repeated iterations, each iteration using four calibration tones 13 that will produce outputs in the frequency spectrum 19 of the output of the sampler 10 at four related frequencies according to the equation given above and as subject to aliasing. Hence, for each iteration, calibration tones 13 are injected at each of the four related frequencies and the outputs 21 at each of the four related frequencies for each calibration tone 13 are measured making a total of sixteen measurements per iteration.

The output spectra 19 in response to four calibration tones 13 are illustrated in FIG. 2. For each spectrum 19 of FIG. 2, frequency is plotted over the range zero to half the overall sampling frequency of the sampler 10 against magnitude. The sixteen frequency domain measurements of the complex amplitudes (shown in FIG. 2) are the result of the convolution in the frequency domain of the frequency spectrum of the input signal and the frequency spectrum of the interleaved channel responses at that frequency. The channel response in the time domain repeats every four samples and consequently the frequency spectrum consists of four spikes 23 in the frequency domain.

The relationship matrix for any set of N related frequencies is denoted here by E and is determined during the calibration method described herein.

The values of the complex amplitudes (denoted here by A) for each combination of calibration tone 13 and output 21 at each of the N related frequencies can be expressed in terms of the complex amplitude of the input signal, and the frequency response of the interleaved channel responses, denoted here by e, that result from the convolution described previously. The digital input signal is the digital equivalent of the complex amplitude of the calibration tone 13 in the frequency domain and is denoted here by s. The expressions are as follows:

$$\lambda_{0,0}=s^*_0 \cdot e_{0,0} \quad \lambda_{0,1}=s^*_0 \cdot e_{0,1} \quad \lambda_{0,2}=s_0 \cdot e_{0,1} \quad \lambda_{0,3}=s^*_0 \cdot e^*_{0,2}$$

$$\lambda_{1,0}=s^*_1 \cdot e_{1,1} \quad \lambda_{1,1}=s_1 \cdot e_{1,0} \quad \lambda_{1,2}=s^*_1 \cdot e_{1,2} \quad \lambda_{1,3}=s_1 \cdot e_{1,1}$$

$$\lambda_{2,0}=s_2 \cdot e^*_{2,1} \quad \lambda_{2,1}=s^*_2 \cdot e_{2,2} \quad \lambda_{2,2}=s_2 \cdot e_{2,0} \quad \lambda_{2,3}=s^*_2 \cdot e^*_{2,1}$$

$$\lambda_{3,0}=s^*_3 \cdot e_{3,2} \quad \lambda_{3,1}=s_3 \cdot e^*_{3,1} \quad \lambda_{3,2}=s^*_3 \cdot e^*_{3,1} \quad \lambda_{3,3}=s_3 \cdot e_{3,0}$$

where $e_{0,2}=e^*_{0,2}$, $e_{0,3}=e^*_{0,1}$ and so on due to aliasing. The subscripts for $\lambda$ and e are the input frequency number followed by output frequency number; the subscript for s is the input frequency number. An asterisk denotes a complex conjugate. The complex conjugates occur because the implicit convolution in the frequency domain described previously has contributions from both the positive and the negative parts of the spectrum (for example, see page 31 of 'An Introduction to the Analysis and Processing of Signals' by Paul A. Lynn, Third Edition, published by Macmillan).

Determining the complex amplitude of each of the digital input signals s and measuring the outputs $\lambda$ allows the relationship matrix E to be calculated for each calibration tone 13 using the above equations. Using an independent measurement of the calibration tones 13 ensures a normalization which, to within the accuracy of the independent measurement, provides a flat amplitude frequency response and linear phase during the later equalisation process. This is as well as ensuring that the channels are equalised.

During normal operation, where channel equalisation is being performed rather than calibration, the output in a particular frequency bin of the FFT 15 will consist of a contribution from the input signal component of that frequency and the spurious contributions due to channel mismatch and timing errors from the related frequencies. One must remember that in a four-channel sampler, injection of a calibration tone leads to four spikes in the output frequency spectrum and, conversely, each spike in the output frequency spectrum is derived from any inputs at the four related frequencies. During normal operation, it is the real inputs y (akin to s for the calibration process) and not the measured outputs x in the frequency bins (akin to s for the calibration process) that are to be calculated, thereby allowing removal of the spurious contributions in the frequency bins. The four measured outputs (labelled as $x_0$ to $x_3$) in the frequency bins of the FFT for each calibration iteration can be written as:

$$x_0=y_0 \cdot e_{0,0}+y^*_1 \cdot e_{1,1}+y_2 \cdot e^*_{2,1}+y^*_3 \cdot e_{3,2}$$

$$x_1=y^*_0 \cdot e_{0,1}+y_1 \cdot e_{1,0}+y^*_2 \cdot e_{2,2}+y_3 \cdot e^*_{3,1}$$

$$x_2=y_0 \cdot e_{0,1}+y^*_1 \cdot e_{1,2}+y_2 \cdot e_{2,0}+y^*_3 e^*_{3,1}$$

$$x_3=y^*_0 \cdot e_{0,2}+y_1 \cdot e_{1,1}+y^*_2 \cdot e^*_{2,1}+y_3 \cdot e_{3,0}$$

Re-arranging by taking the complex conjugate of each alternate row:

$$x_0=y_0 \cdot e_{0,0}+y^*_1 \cdot e_{1,1}+y_2 \cdot e^*_{2,1}+y^*_3 \cdot e_{3,2}$$

$$x^*_1=y_0 \cdot e^*_{0,1}+y^*_1 \cdot e^*_{1,0}+y_2 \cdot e^*_{2,2}+y^*_3 \cdot e_{3,1}$$

$$x_2=y_0 \cdot e_{0,1}+y^*_1 \cdot e_{1,2}+y_2 \cdot e_{2,0}+y^*_3 \cdot e^*_{3,1}$$

$$x^*_3=y_0 \cdot e^*_{0,2}+y^*_1 \cdot e^*_{1,1}+y_2 \cdot e_{2,1}+y^*_3 \cdot e^*_{3,0}$$

This expression can now be written in matrix form (where a dash denotes that alternate rows have been conjugated):

$$E' = \begin{pmatrix} e_{0,0} & e_{1,1} & e_{2,1}^* & e_{3,2} \\ e_{0,1}^* & e_{1,0}^* & e_{2,2}^* & e_{3,1} \\ e_{0,1} & e_{1,2} & e_{2,0} & e_{3,1}^* \\ e_{0,2}^* & e_{1,1}^* & e_{2,1} & e_{3,0}^* \end{pmatrix} \quad x' = \begin{pmatrix} x_0 \\ x_1^* \\ x_2 \\ x_3^* \end{pmatrix} \quad y' = \begin{pmatrix} y_0 \\ y_1^* \\ y_2 \\ y_3^* \end{pmatrix}$$

such that x'=E'y'.

This equation can be solved to give the real inputs by calculating the inverse of the relationship matrix, the correction matrix $A=E'^{-1}$ during calibration, then under normal operation applying this inverse matrix A to the measured spectrum to give the real input in the frequency domain, according to y'=Ax'.

Alternate values of x should be complex conjugated before output if the phase of the output frequency spectrum is of interest or if an output signal in the time domain is required (the latter can then be obtained by performing an inverse FFT operation).

So, a single matrix multiplication equalises N of the frequency bins of the is FFT 15. As described previously, the calibration process can be repeated to produce a different set of N related frequencies, thereby calibrating a further N of the frequency bins of the FFT 15. The calibration iterations can be repeated until all frequency bins are calibrated. During normal operation, the set of correction matrices generated in this way must all be multiplied with the outputs in their corresponding four frequency bins to equalise the entire frequency spectrum. Alternatively, adjacent frequency bins may be grouped together and a single calibration performed for that group. For example, groups of five bins could be formed, such that bins 1 to 5 form one set, 6 to 10 the next, 11 to 15 the next and so on. The first calibration iteration could then be performed such that the N related frequencies correspond to the centre frequencies of bin numbers 3, 8, 13 and 18, i.e. the central frequency within each group of five frequency bins. The same correction matrix would then be used to equalise the 5*N frequency bins by 5 matrix multiplies.

Although not essential, better performance can be obtained during channel equalisation if allowance is made for the following special cases. Frequency bins at frequencies of $\frac{1}{8}f_s$ or $\frac{3}{8}f_s$ are special cases because pairs of the related frequencies overlap, i.e. the four related frequencies appear as spikes 23 at only two related frequencies. In these special cases, the appropriate corrections from adjacent frequency bin can be substituted or can be used for interpolation. Frequency bins at frequencies of 0, $\frac{1}{4}f_s$ or $\frac{1}{2}f_s$ are also special cases. At these frequencies the effects of DC (i.e. 0 Hz) offsets between the channels appear in addition to pairs of spikes 23 combining into one. The DC offsets can be subtracted off in each channel separately. The DC levels can be measured by taking the mean of the samples from each channel, or by measurements independent of the sampler. For this second special case, adjacent measurements can also be used to correct the effected frequencies as described immediately before.

As will be readily evident, variations to the above embodiment are possible without departing from the scope of the invention.

For instance, whilst the above embodiment uses a measurement of each calibration tone 13 obtained independently of the sampler 10 to determine the complex amplitude of the digital input signal, this complex amplitude may be derived partially or fully from the sampler output 21. If only the amplitude and not the phase is given by independent means then a measurement of the phase is given by the phase of the output at the input frequency in the spectrum of the sampler output. The equalisation will then provide a flat amplitude frequency response but not linear phase. An alternative normalisation is to use the output measurement at the input frequency and so not use any independent measurement of the input. The channels will still be matched but neither a flat amplitude frequency response or linear phase is guaranteed.

Other variations to the embodiment described above may include using calibration signals other than single tones, e.g. injection of a band-limited noise or a chirp waveform that occupied a portion of the bandwidth of the sampler would allow calibration of a number of frequency bins simultaneously. However, to be effective the calibration signal could not occupy the whole bandwidth since it must only affect one of the N related frequencies at any one time.

Also, during normal processing, as opposed to calibration, it is not necessary to correct for all the frequency bins, instead just the largest signals may be identified and just their related frequencies corrected. A window function may be employed in conjunction with the FFT.

Rather than using an FFT, other spectral estimation algorithms can be equally well employed.

If the ADCs 12a–d are under-sampling a particular bandwidth, then the method is still applicable and the calibration frequencies can be injected at the higher pass-band. Another possible alternative is instead of staggering the triggers for the ADCs 12a–d to implement the interleaving, staggered delays in the channels can be used with the ADCs 12a–d sampling simultaneously.

The methods described herein above can be applied to a wide variety of multi-channel sampling architectures, for example electro-optic samplers where the individual channels and the sampling process are partially optical. The algorithm applies equally well for complex data input signals.

The invention claimed is:

1. A method of calibrating a sampler comprising a plurality (N) of time-interleaved channels, each sampled by an ADC, said sampler having an input for receiving an analogue input signal and an output for providing a digital output signal, and the method comprising the steps of:
   (a) injecting in turn N calibration signals into the input of said sampler such that each calibration signal occupies at least one of N related frequencies, wherein the related frequencies are those for which, given an input signal at any one of those frequencies, mismatches in the interleaving channels affect the resultant output of the sampler at the other related frequencies;
   (b) measuring in the frequency domain of the interleaved sampled data the output signal at each of the N related frequencies for each one of the N calibration frequencies; and
   (c) determining the relationship that relates the input signal to the output signal at each of the N related frequencies for each one of the N calibration frequencies.

2. A method according to claim 1, wherein in step (a) each calibration signal comprises a single tone.

3. A method according to claim 1, wherein step (b) further comprises performing an FFT of the interleaved digital outputs of the ADCs thereby to allow measurement in the frequency domain of the output at each of the N related frequencies.

4. A method according to claim 3, further comprising the step of choosing the first of the N related frequencies such that all the resulting N related frequencies have frequencies substantially centred on bins of the FFT.

5. A method according to claim 3, further comprising the step of repeating steps (a) to (c), injecting in turn N calibration frequencies into the sampler at a different set of N related frequencies.

6. A method according to claim 3, wherein adjacent bins of the FFT are grouped together and a single calibration frequency used for each group.

7. A method according to claim 1, further comprising the step of forming a relationship matrix, or a relationship matrix for each iteration of the calibration process, to embody the relationship that relates the input signal to the output at each of the N related frequencies for each one of the calibration frequencies.

8. A method according to claim 1, further comprising the step of determining the magnitude and/or phase of the input signal either by independent means or by measuring the magnitude and/or phase in the output of the sampler.

9. A method according to claim 1, including in step (a) determining the magnitude and phase of the input signal for each one of the N calibration frequencies, and wherein step (b) comprises measuring in the frequency domain the magnitude and phase of the output at each of the N related frequencies for each one of the calibration frequencies and step (c) comprises determining correction factors from the relationship that relates magnitude and phase of the output at the N related frequencies to the magnitude and phase of the input signal.

10. A method of performing an analogue to digital conversion using a sampler comprising N time-interleaved ADCs, wherein the sampler has been calibrated in accordance with the method of claim 1, the method of performing an analog to digital conversion comprising the steps of (i) injecting an analogue signal into the sampler; (ii) measuring in the frequency domain the resulting spectrum produced by the sampler; and (iii) adjusting the measured frequency spectrum in response to the relationships determined during calibration thereby to produce a channel-equalised spectrum.

11. A calibration apparatus for calibrating a time interleaved analogue to digital sampler said sampler comprising a plurality (N) of time-interleaved channels, each sampled by an ADC, said sampler having an input for receiving an analogue input signal and an output for providing a digital output signal, and the apparatus including:
 (a) means for injecting in turn N calibration signals into the input of said sampler such that each calibration signal occupies at least one of N related frequencies, wherein the related frequencies are those for which, given an input signal at any one of those frequencies, mismatches in the interleaving channels affect the resultant output of the sampler at the other related frequencies;
 (b) means for measuring in the frequency domain of the interleaved sampled data the output signal at each of the N related frequencies for each one of the N calibration frequencies; and
 (c) means for determining the relationship that relates the input signal to the output signal at each of the N related frequencies for each one of the N calibration frequencies.

12. A channel equaliser for an analogue to digital sampler, comprising the calibration apparatus of claim 11, wherein the said means for determining the relationship is operable to adjust a frequency domain signal derived from output of the sampler according to the relationships determined during calibration thereby to produce a channel-equalised spectrum.

13. A computer that is programmed for carrying out the method of claim 1, and to perform the steps of:
 (1) receiving the measurements of the output at each of the N calibration frequencies for each one of the N calibration frequencies;
 (2) determining the relationship that relates the input signal to the output at each of the N related frequencies for each one of the N calibration frequencies.

14. A computer readable medium comprising program instructions for causing a computer to operate in accordance with claim 13.

* * * * *